US008872294B2

(12) United States Patent
Meade et al.

(10) Patent No.: US 8,872,294 B2
(45) Date of Patent: Oct. 28, 2014

(54) METHOD AND APPARATUS FOR REDUCING SIGNAL LOSS IN A PHOTO DETECTOR

(75) Inventors: Roy Meade, Boise, ID (US); Zvi Sternberg, Metar (IL); Ofer Tehar-Zahav, Hadera (IL)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/590,241

(22) Filed: Aug. 21, 2012

(65) Prior Publication Data
US 2014/0054736 A1  Feb. 27, 2014

(51) Int. Cl.
*H01L 31/18* (2006.01)

(52) U.S. Cl.
USPC ............... 257/432; 257/458; 257/E31.128; 257/E33.046; 257/E33.049

(58) Field of Classification Search
CPC ...... H01L 31/18; H01L 31/028; H01L 31/105; H01L 31/125; H01L 31/0232; H01L 31/0312
See application file for complete search history.

(56) References Cited

U.S. PATENT DOCUMENTS

| 7,524,690 B2 | 4/2009 | Ko et al. |
| 2004/0017962 A1 | 1/2004 | Lee et al. |
| 2006/0189050 A1 | 8/2006 | Jones |
| 2007/0104410 A1 | 5/2007 | Ahn et al. |
| 2007/0104441 A1 | 5/2007 | Ahn et al. |
| 2010/0314752 A1 | 12/2010 | Yu et al. |
| 2011/0027950 A1 | 2/2011 | Jones et al. |
| 2011/0115040 A1 | 5/2011 | Su et al. |
| 2013/0001723 A1* | 1/2013 | Meade ............. 257/432 |

* cited by examiner

Primary Examiner — Minh-Loan T Tran
Assistant Examiner — Fazli Erdem
(74) Attorney, Agent, or Firm — Dickstein Shapiro LLP

(57) ABSTRACT

Photonic structures and methods of formation are disclosed in which a photo detector interface having crystalline misfit dislocations is displaced with respect to a waveguide core to reduce effects of dark current on a detected optical signal.

20 Claims, 5 Drawing Sheets

US 8,872,294 B2

METHOD AND APPARATUS FOR REDUCING SIGNAL LOSS IN A PHOTO DETECTOR

FIELD OF THE INVENTION

Embodiments are described which are directed to reducing optical signal losses in a photo detector.

BACKGROUND OF THE INVENTION

Photonic devices are now being integrated on a same substrate as electronic circuits, such as CMOS circuits. The substrate material for such integration is typically silicon, either as bulk silicon or as a silicon on insulator structure. Many photonic devices can be formed in a patterned silicon layer provided over the substrate. For example, a waveguide core can be formed of silicon over a substrate, the latter of which can also be a silicon substrate, provided the silicon waveguide core is surrounded by a cladding having a lower index of refraction than the silicon of the core. Silicon dioxide is often used as a suitable cladding material as it has an index of refraction of about 1.45 compared to a refractive index of about 3.45 for silicon. Other materials can also be used for the waveguide core and cladding material provided there is a sufficient difference between the higher refractive index of the core and lower refractive index of the cladding.

However, some photonic devices must be formed of materials other than silicon, but which interface with silicon. A photo detector, for example, a PIN photodiode having P and N regions with an intrinsic region between, can be formed of silicon for the P and N regions and germanium or a silicon-germanium material (for a silicon-germanium material for use in a photo detector the germanium mole fraction should be at least 30%) for the intrinsic region. For purposes of discussion herein, whenever a silicon germanium material is discussed it will be presumed to have a germanium mole fraction of at least 30%. Germanium or silicon-germanium are often preferred for use in a photo detector for receiving light because they are more sensitive to light compared with silicon at the wavelengths greater than 1.1 μm.

When a germanium or silicon-germanium material is formed in contact with silicon, for example at the interface with the silicon P or N regions of a PIN diode, crystal lattice mismatch defects occur at the interface. For example, at a germanium-to-silicon interface, there is a 4.2% lattice mismatch. A lattice mismatch creates misfit dislocations which creates charge trap states at the interface. The trap states can interfere with the photoelectric conversion process by producing energy levels in the band gap of the photo detector which result in the production of dark current. Dark current reduces the overall signal to noise ratio of the photo detector and reduces its responsiveness to the photoelectric conversion of received light.

A photo detector structure and method of making it which lessens the effect of the misfit dislocations and corresponding trap states on the photo detector responsiveness to light would be desirable.

DETAILED DESCRIPTION OF THE INVENTION

Embodiments described herein provide a photo detector in which misfit dislocation and associated charge trap states at the interface between an intrinsic region, e.g. of a germanium or silicon-germanium, and a semiconductor, e.g. silicon, region do not reside on the same plane as a waveguide core which is optically coupled to the intrinsic region of the photo detector. By displacing the interface and associated misfit dislocations and trap states to a level below or above that of the waveguide core, the defects are removed from the light receiving intrinsic region of a photo detector. This reduces dark current and provides an improved photo detector signal to noise ratio.

Figure 1:
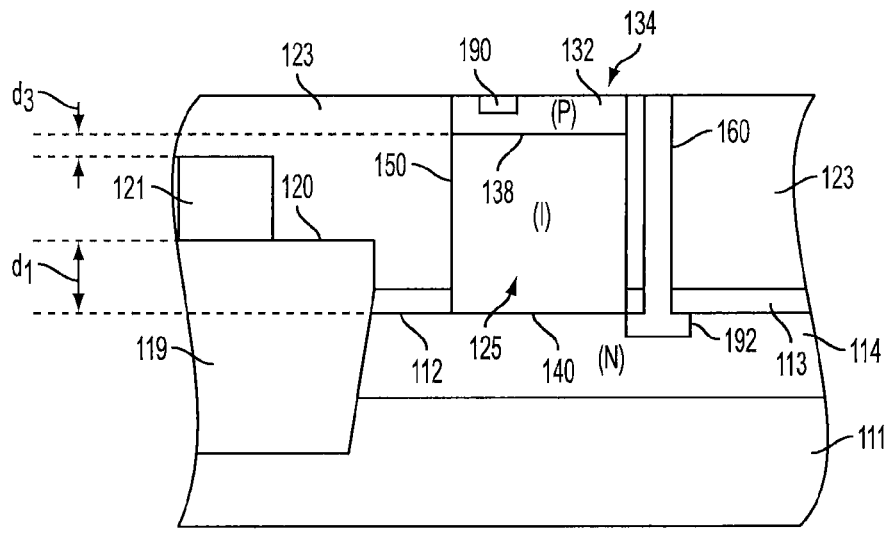
FIG. 1 illustrates a first embodiment of the invention.

FIG. 1 illustrates a first structural embodiment in which a PIN diode photo detector 134 is formed to receive light from an adjacent waveguide core 121. A silicon substrate 111 has a shallow trench isolation region formed therein containing an oxide 119, e.g., silicon dioxide. The shallow trench isolation region provides an upper surface 120 on which the waveguide core 121 is formed. The shallow trench isolation region may have a thickness of at least 1 μm. The waveguide core 121 can be formed of silicon which has a higher index of refraction than the trench oxide 119. An oxide 123, e.g., silicon dioxide, is also provided on the sides and over the waveguide core 121 such that the waveguide core 121 is surrounded by a cladding oxide. In this manner, an optical waveguide is formed by core 121 and the cladding provided by the oxide 119 and oxide 123. Other materials can also be used to form core 121 and cladding 119 and 123 provided the index of refraction of the material of the waveguide core 121 is higher than the index of refraction of the cladding material.

The silicon substrate 111 has an upper surface 112 which is recessed below the level of the oxide surface 120 on which waveguide core 121 is formed. A pad oxide 113 is provided at the upper surface 112 of the silicon substrate 111. Alternatively, the pad oxide 113 can be omitted, as will be further described below with respect to a method for forming the FIG. 1 structure. An intrinsic region 125 of the PIN photo detector 134 is formed of, for example, germanium or silicon-germanium and is provided within an opening 150 in oxide 123 such that the lower surface of the intrinsic region 125 forms an interface 140 with the silicon substrate 111. Silicon substrate 111 includes an N-well region 114 at its upper portion. The interface 140 between material of the intrinsic region 125 and the underlying silicon N-well 114, where misfit dislocations will occur, is displaced downwardly below the upper surface 120 of the oxide 119 and thus below the lowermost level of waveguide core 121. The upper surface 112 of the silicon substrate 111 is elevationally displaced downwardly from the upper surface 120 of oxide 119 by a distance $d_1$ within the range of from about 1 angstrom to about 10 nanometers. As a consequence, the interface 140 is placed below the area of intrinsic region 125 which receives light from waveguide core 121 and dark current is reduced. The upper surface of the intrinsic material 125 is also recessed within the opening 150 and a layer of P doped silicon is formed therein as a silicon plug 132. The interface 138 of the intrinsic material 125 with the silicon plug 132 is elevationally displaced upwardly relative to the upper surface of waveguide core 121 also by a distance $d_3$ within the range of from about 1 angstrom to about 10 nanometers to reduce the effects of the interface trap states at that interface on photons received from the waveguide core 121.

FIG. 1 also shows a more heavily N doped ohmic contact region 192 in the N-well 114 for connecting with a conductor filled via 160 which provides electrical connection with the N-well 114. Likewise, an ohmic contact region 190 which is more heavily P doped than silicon plug 132 is provided within the silicon plug 132 for making electrical contact to the silicon plug 132.

As shown in FIG. 1 the waveguide core is laterally spaced slightly from the PIN diode photo detector 134 such that coupling of the waveguide core 121 to the intrinsic material 125 is by evanescent coupling. In operation, photons received by the intrinsic material 125 from core 121 are converted to electrons and holes which respectively flow to the N-well 114 and P type silicon plug 132 with little effect on photon conversion by the trap states at the interfaces of the intrinsic material 125 with the N-well 114 and silicon plug 132

Figure 2:
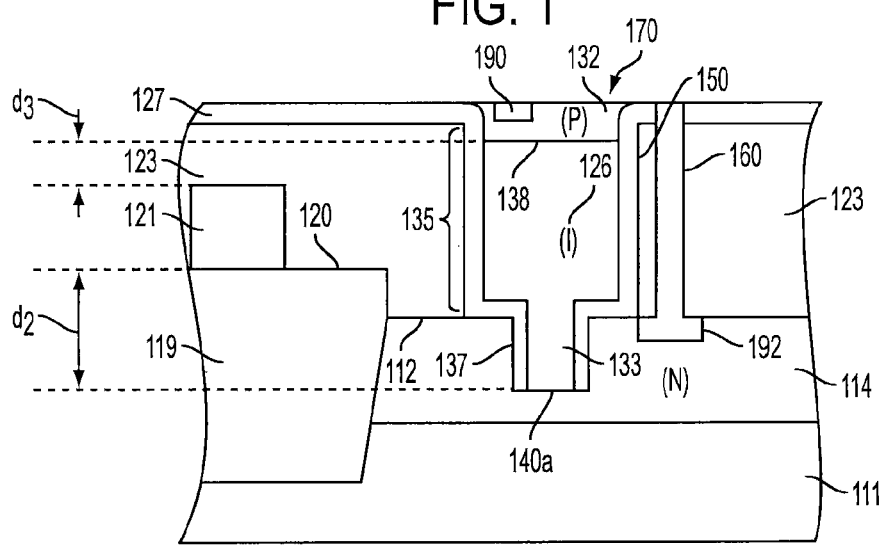
FIG. 2 illustrates a second embodiment of the invention.

FIG. 2 illustrates another embodiment in which the interface 140a of the intrinsic region 126 and N-well region 114 of photo detector 170 is displaced below the upper surface of oxide 119 and thus below the lowest level of the waveguide core 121. In this embodiment a high aspect ratio (depth divided by width) structure is provided by a first upper opening portion 135 provided in the oxide 123 and below that a second lower opening portion 137 provided within N-well 114. The sidewalls of the upper and lower opening portions 135 and 137 are lined with an oxide liner 127 which also may extend over the waveguide cladding oxide 123. The oxide liner 127 is not present at the bottom of the lower opening portion 137. The upper opening portion 135 and lower opening portion 137 are filled with an intrinsic material, for example, germanium or silicon-germanium to form the intrinsic region 126 of photo detector 170. The intrinsic material may be N or P-type and has a low dopant concentration of less than 1E15 cm-3. For example, the intrinsic material can be an N-type with a dopant concentration of less than 1E15 cm-3. The interface of the intrinsic region 126 and N-well region 114 of silicon substrate 111 at the bottom of the opening portion 137 is again displaced below the upper surface of the shallow trench oxide 119 by a distance d2 within the range of about 1 angstrom to about 10 nanometers. and thus below the lowest level of waveguide core 121. The upper surface of the intrinsic material region 126 within the upper opening portion 137 is recessed and a P doped silicon plug 132 is formed in the recess. The interface 138 of the intrinsic region 126 and P doped silicon plug 132 is also displaced above the upper surface of the waveguide core 121 by a distance d3 within the range of about 1 angstrom to about 10 nanometers to reduce dark current at trap states at that interface.

The FIG. 2 embodiment also has the waveguide core 121 laterally spaced from the intrinsic region 126 and uses evanescent coupling between them for optical signal transfer from the core 121 to the intrinsic region 126.

The FIG. 2 embodiment also includes a conductive via 160 extending through the oxide 123 and the oxide liner 127 to the N-well 114 and a more heavily doped N region 192 in the N-well for providing a good ohmic contact to the N-well 114. The silicon plug 132 also includes a more heavily doped P region 190 for providing a good ohmic contact to the silicon plug 132.

The FIG. 1 and FIG. 2 embodiments show a lateral spacing and evanescent coupling between the waveguide core 121 and photo detector 134 (FIG. 1) or 170 (FIG. 2). However, FIGS. 1 and 2 can be modified to obtain a butt coupling of the waveguide core 121 to the photo detector, by having the waveguide core 121 butt up against the intrinsic region of photo detector 134 (FIG. 1) or 170 (FIG. 2), as shown in respective FIGS. 3 and 4. In FIG. 4 the butt coupling has an intervening oxide liner 127 between the waveguide core 121 and photo detector 170. Transmission from the waveguide core 121 to the photo detector 170 is maximized when the intervening oxide thickness is one quarter of the wavelength of incoming light, when measured in a vacuum, divided by the refractive index of the oxide, in effect creating a quarter-wave coating.

One example of a method of making the FIG. 1 structure will now be described with respect to FIGS. 5A-5E. Except for locating the waveguide core 121 and photo detector 134 against one another, the same method can be used to make the FIG. 2 structure.

Figure 5A:
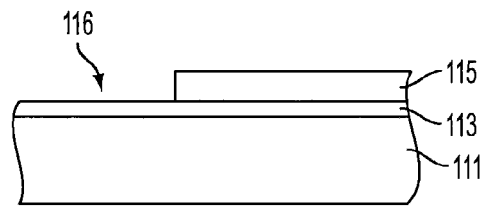
FIGS. 5A, 5B, 5C, 5D, 5E illustrate successive steps of a method embodiment for forming the FIG. 1 embodiment.

FIG. 5A illustrates a silicon substrate 111 on which a pad oxide 113, e.g., silicon dioxide, is formed by, for example, thermal growth or by deposition techniques. A hard mask 115 is deposited over the pad oxide 113 and patterned by, for example, selective etching to provide an opening 116 to the pad oxide 113. The hard mask can be formed of various materials, for example, silicon nitrite, a combination of silicon nitrite and a silicon oxide, or other hard mask material which will allow selectively etching of the pad oxide 113 and silicon substrate 111 without also etching the hard mask 115.

Figure 5B:
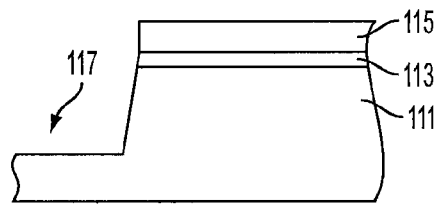
Figure 5C:
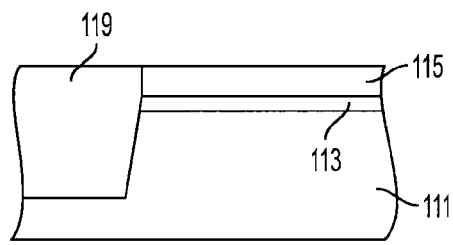

As shown in FIG. 5B, the patterned hard mask 115 is next used as etch mask and both the pad oxide 113 and underlying silicon substrate 111 are etched using known etching techniques to form a shallow trench 117. As shown in FIG. 5C, the trench 117 is filled with an oxide 119, e.g., silicon dioxide, which is then planarized to the upper level of hard mask 115. The shallow trench may have a depth of at least 1 µm.

Figure 5D:
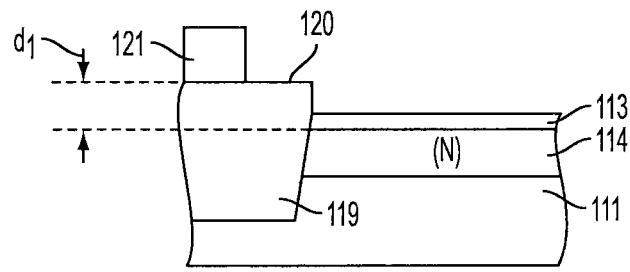

Next, as shown in FIG. 5D, the hard mask 115 is removed using known techniques and a waveguide core material, e.g. silicon, is deposited over the oxide 119 and patterned to form a waveguide core 121. The pad oxide 113 can also be optionally removed at this point, or can remain in place as shown in FIG. 5D. In addition, an N type well 114 is formed in the silicon substrate 111 by dopant implants. If the pad oxide 113 is not removed this implant doping occurs through the pad oxide 113. As shown in FIG. 5D the upper surface N-well 114 is now elevationally displaced downwardly by a distance $d_1$ relative to the level of the upper surface 120 of the oxide 119 and lower surface of the waveguide core 121. The amount of this distance $d_1$ is determined by the thickness of the hard mask 115, both of which may be within the range of about 1 angstrom to about 10 nm.

Figure 5E:
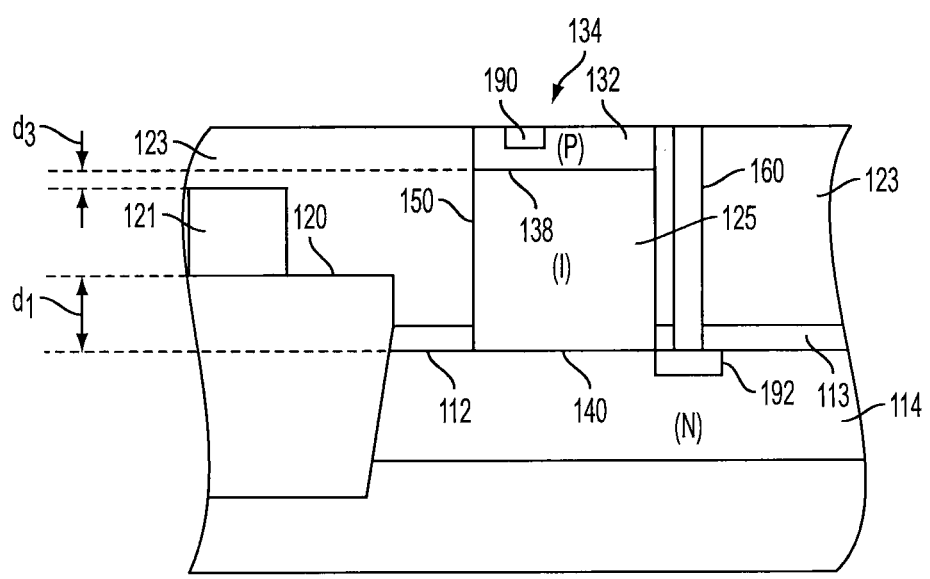

Following this, as shown in FIG. 5E, an oxide 123, e.g. silicon dioxide, is deposited over the silicon substrate 111 and waveguide core 121 and selectively etched to form an opening 150 in which a photo detector 134 will be formed. The photo detector 134 is formed by epitaxial growth of an intrinsic material 125, for example, germanium or silicon germanium within the opening 150 until the growth reaches the upper surface of the oxide 123. The epitaxial growth is planarized to the upper surface of oxide 123. Following this, the intrinsic material 125 is etched back within opening 150 to form a recess in opening 150. A silicon layer is then deposited over the substrate and oxide 123 and planarized to the level of the oxide 123 to fill the recess with a silicon plug 132. The silicon plug 132 is doped with a P type dopant and together with intrinsic region 125 and N-well 114 forms a PIN diode structure as photo detector 134.

The interface 140 of the intrinsic region 125 and N-well 114 and the interface 138 of the intrinsic region 125 and P type silicon plug 132 are both elevationally displaced respectively by distances d1 and d3 away from the lower and upper surfaces of waveguide core 121 so that trap states at the interfaces are displaced away from the region within the intrinsic material 125 where photo conversion occurs. As noted, the amount by which the interface 138 is lowered relative to the lower level of the waveguide core 121 is set by the thickness of the hard mask 115, so a desired level offset can be easily obtained by controlling the fabrication thickness of hard mask 115. The amount by which the interface between the intrinsic region 125 and silicon plug 132 is displaced upwardly from the upper surface of the waveguide core 121 is determined by the thickness of oxide 123 and the depth of the recess in opening 150 formed by etching back the intrinsic material 125 and may be chosen to also produce an upward displacement of the interface relative to the upper surface of waveguide core 121 having a distance d3.

FIG. 5E also shows formation of ohmic contact areas 190 in the silicon plug 132 and 192 in the N-well 114. Ohmic contact area 190 is more heavily P doped than the silicon plug 132, while the ohmic contact area 192 is more heavily N doped than the N-well 114. A conductive via 160 is also formed to connect with ohmic contact area 192. As an alternative silicon plug 132 can be doped sufficiently high to provide an ohmic contact and the contact area 190 can be a salicided area of silicon plug 132.

Figure 6A:
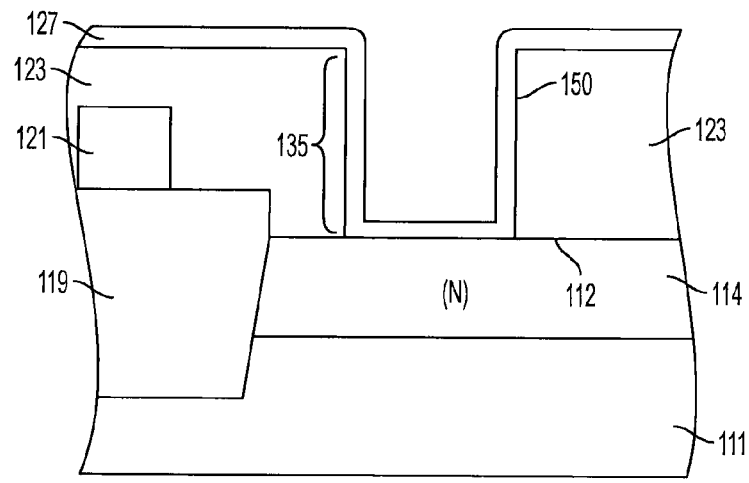
FIGS. 6A, 6B, 6C illustrate successive steps of a second method embodiment for forming the FIG. 2 embodiment.
Figure 6B:
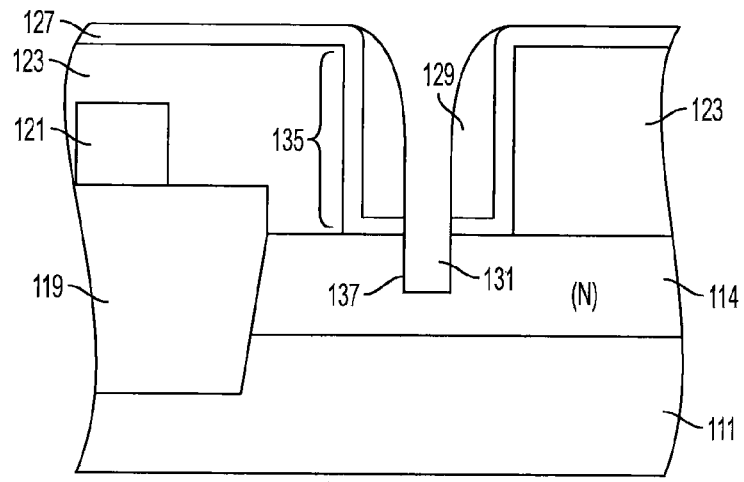
Figure 6C:
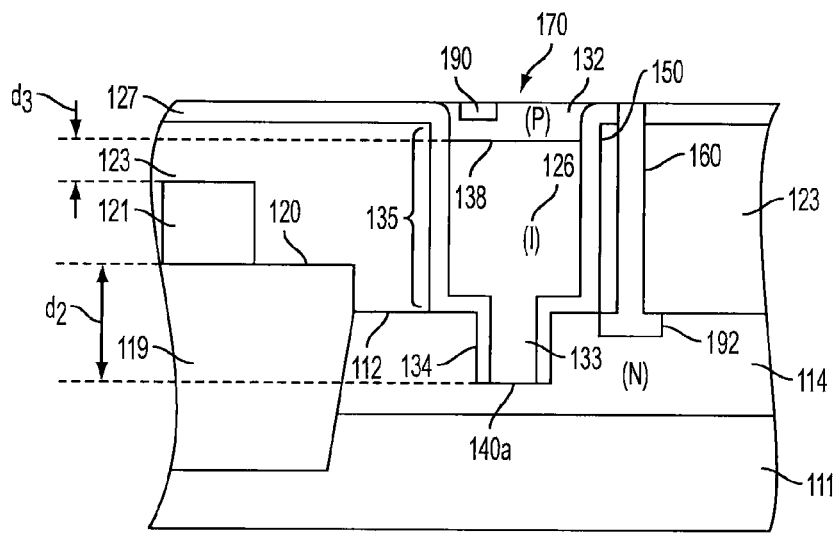

FIGS. 6A through 6C illustrate an example method for forming the FIG. 2 structure. The method follows the process flow in FIGS. 5A through 5D. After the structure in FIG. 5D is formed and the N-well 114 is formed in the silicon substrate 111, the pad oxide 113 is removed, or optionally retained, and an oxide, e.g. silicon dioxide, layer 123 is formed over the waveguide core 121 and silicon substrate 111. FIGS. 6A through 6C show that the oxide pad 113 is removed. Next, an opening 150 is etched in oxide 123 down to the surface 112 of the N-well 114 within silicon substrate 111 at the area where the photo detector 170 will be formed. This forms an upper opening portion 135. An oxide, e.g. silicon dioxide, liner 127 is formed on the sidewalls of the opening portion 135 and on the surface of oxide layer 123. Following this, a spacer 129 of, e.g. silicon nitride, is formed over the oxide liner 127 on the sidewalls of the upper opening 135. The bottom of oxide liner 127 and N-well 114 are then etched using the spacer 129 as the etch mask to form a lower opening portion 137, as shown in FIG. 6B. The upper opening portion 135 is wider than the lower opening portion 137, for example, by an order of magnitude. Next, the spacer 129 is removed from the first upper opening portion 135 and following this the exposed surfaces of the N-well at the sidewalls of the lower portion 137 are lined with an oxide 134, e.g. silicon dioxide, either by thermal growth or deposition. The oxide liner 134 is then anisotropically etched at the bottom of the second lower opening portion 137 to expose the N-well 114. The opening, both upper 135 and lower 137 portions, is then filled with intrinsic material 126, for example, germanium or silicon-germanium. The interface 140a of the intrinsic material 126 and N-well 114 is at a distance $d_2$ well below the lowest level of the waveguide core 121 such that trap states at the interface 140a produce a reduced dark current which improves the signal to noise ratio of photo detector 170. As noted with respect to FIG. 2, the distance of $d_2$ is within the range of 1 angstrom to 10 nm.

The intrinsic material 135 within the opening 150 is etched back to recess its upper surface and silicon is deposited and P-type doped and planarized to the level of the oxide liner 127. The interface 138 between the silicon plug 132 and intrinsic material 126 is displaced upwardly relative to the top surface of waveguide core 121 by a distance $d_3$ which is within the range of about 1 angstrom to about 10 nm. An ohmic contact area 190 is formed in the silicon plug 132, by making it more heavily P-doped than the remainder of silicon plug 132. Alternatively, the silicon plug 132 can be doped sufficiently high to provide an ohmic contact and the contact area 190 can be a salicided area of silicon plug 132. Likewise, an ohmic contact area 192, which is more heavily N doped than N-well 114, is formed in the N-well 114. A conductive via is formed in the oxide 123 and connects with ohmic contact area 192.

Figure 3:
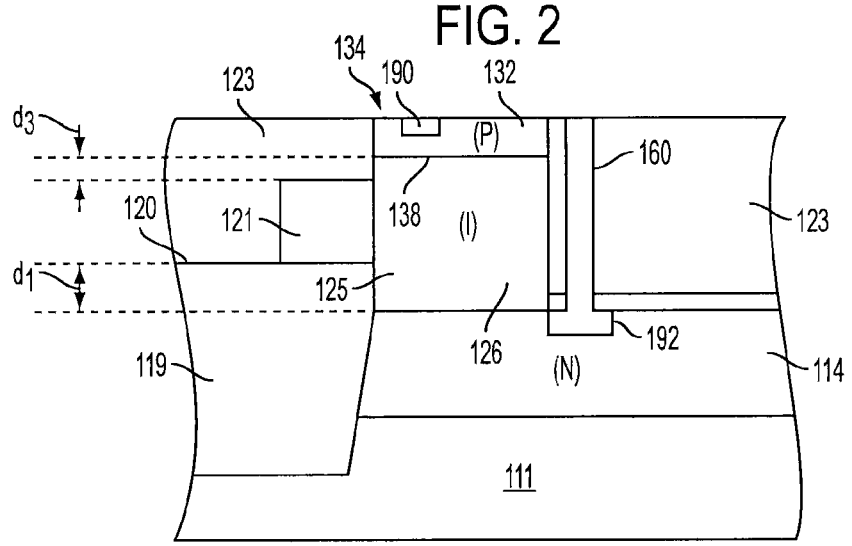
FIG. 3 illustrates a third embodiment of the invention.
Figure 4:
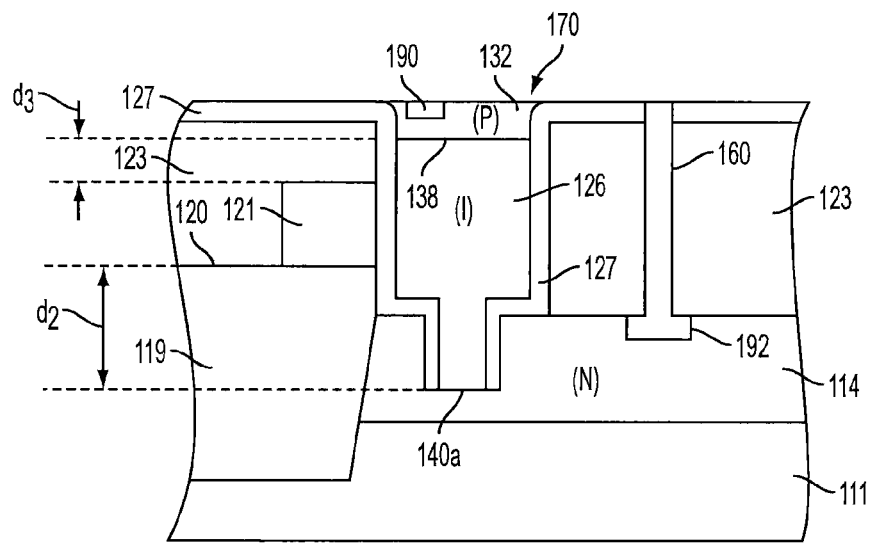
FIG. 4 illustrates a fourth embodiment of the invention.

The structures illustrated in FIGS. 3 and 4 where the waveguide core 121 abuts the photo detector 134 or 170 can be formed by the same methods used to form the structures of FIGS. 1 and 2, except that the location of the formed photo detectors, 134 and 170 and waveguide core 121 are such that they butt up against one another.

It should be understood that while a PIN structure is illustrated in the various embodiments with the silicon plug 132 forming the P region and the N-well 114 in the substrate 111 forming the N region, that the conductivity doping of these regions can be reversed, such that the PIN photo detector is formed with an N-type silicon plug 132 and a P-well 114 in substrate 111. Also, although a PIN diode structure is shown in the illustrated embodiments, the displacement of an interface between dissimilar crystalline structures within a photo detector relative to a waveguide core can also be applied to other diode structures.

Figure 7A:
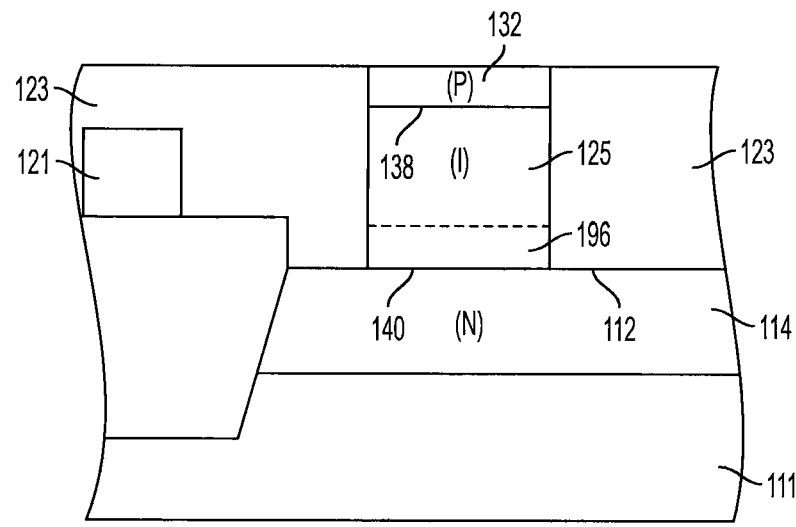
FIGS. 7A and 7B respectively illustrate alternative embodiments.
Figure 7B:
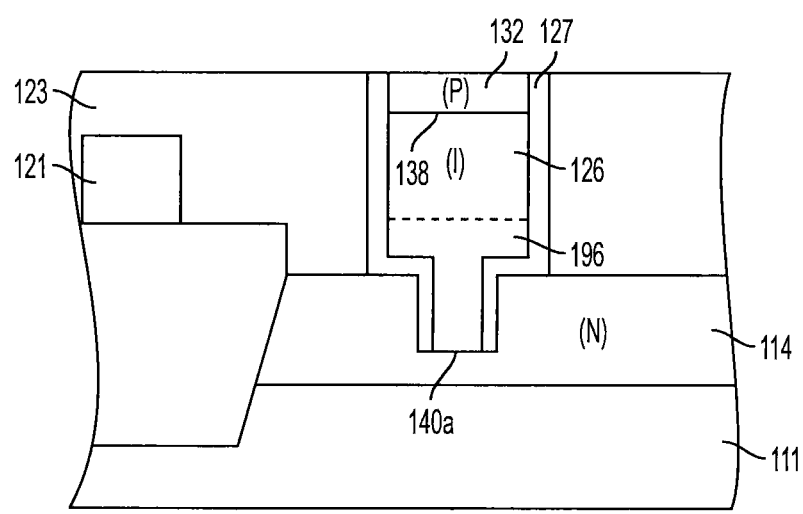

FIGS. 7A and 7B, respectively, show in a simplified form an alternative structure and method of forming the intrinsic region 125 (FIG. 1) or 126 (FIG. 2). When the epitaxial growth of the intrinsic material, e.g. germanium or silicon-germanium starts, the initial growth can be doped to the same conductivity as that of the doped well in the silicon substrate 111 forming a transition region 196. Thus, as the germanium or silicon germanium intrinsic region 125 or 126 begins to form it can be doped N when N-well 114 is provided in the silicon substrate 111. This N-doped transition region 196 of the intrinsic material improves sensitivity of the photo detector 134 or 170. Improved sensitivity can also be obtain by forming the N-doped transition region 196 of doped silicon which transitions during epitaxial growth to the intrinsic region material, e.g. germanium or silicon-germanium.

While various structural and method embodiments are disclosed, these are not limiting of the inventions as modifications can be made which do not depart from the spirit or scope of the invention. Accordingly, the invention is not limited by the drawings or foregoing description, but is only limited by the scope of the claims appended hereto.

What is claimed as new and desired to be protected by Letters Patent of the United States is:

1. A photonic structure comprising:
   a semiconductor substrate having a first semiconductor upper region doped to a first type of conductivity;
   a dielectric material formed in a trench of the semiconductor substrate and extending above the substrate such that an upper surface of the dielectric material has an upper surface which is elavationally higher than an upper surface of the semiconductor substrate;
   a waveguide formed over the upper surface of the dielectric material and having a waveguide core; and
   a photodetector formed over the substrate and having a light receiving region for receiving an optical signal from the waveguide, the photodetector comprising the first semiconductor region of the substrate region and another material in contact with the first semiconductor region and forming a first interface which is elevationally lower than the waveguide core.

2. A photonic structure as in claim 1, wherein the light receiving region comprises an intrinsic region.

3. A photonic structure as in claim 2, wherein the first interface is located at the upper surface of the substrate.

4. A photonic structure as in claim 3, wherein the first semiconductor upper region forms a well in the semiconductor substrate.

5. A photonic structure as in claim 2, wherein the photo detector further comprises a second semiconductor region and a second interface between the intrinsic region and second semiconductor region, the second semiconconductor region having a second type of conductivity.

6. A photonic structure as in claim 5, wherein the first type of conductivity is N-type and the second type of conductivity is P-type.

7. A photonic structure as in claim 5, wherein the first and second semiconductor regions comprise silicon.

8. A photonic structure as in claim 7, wherein the waveguide core comprises silicon.

9. A photonic structure as in claim 7, wherein the intrinsic region comprises one of germanium and silicon-germanium, where the mole fraction of germanium in the silicon germanium comprises at least 30%.

10. A photonic structure as in claim 5, wherein the intrinsic region receives light from the waveguide at a location elevationally displaced from the second interface.

11. A photonic structure as in claim 3, wherein the upper surface of the dielectric material is elevationally displaced from the upper surface of the substrate by a distance within the range of about one angstrom to about 10 nm.

12. A photonic structure as in claim 5, wherein the second interface is elevationally displaced from an upper surface of the waveguide core by a distance within the range of about one angstrom to about 10 nm.

13. A photonic structure as in claim 1, wherein dielectric material forms a shallow trench isolation region having a thickness of at least 1 μm.

14. A photonic structure as in claim 5, further comprising an oxide layer provided over the waveguide core and substrate, the photo detector intrinsic region being formed in an opening of the oxide layer, the second semiconductor region being formed in the opening over the intrinsic region.

15. A photonic structure as in claim 2, wherein the waveguide core is evanescent coupled to the intrinsic region.

16. A photonic structure as in claim 2, wherein the waveguide core is butt coupled to the intrinsic region.

17. A photonic structure as in claim 14, wherein the opening has an upper portion and a lower portion, the upper portion being wider than the lower portion.

18. A photonic structure as in claim 17, wherein the sidewalls of the upper and the lower portion have an oxide liner.

19. A photonic structure as in claim 17, wherein the lower portion extends into the first semiconductor region.

20. A photonic structure as in claim 5, wherein the intrinsic region further comprises a transition region adjacent the first semiconductor region.

* * * * *

UNITED STATES PATENT AND TRADEMARK OFFICE
CERTIFICATE OF CORRECTION

PATENT NO. : 8,872,294 B2  Page 1 of 1
APPLICATION NO. : 13/590241
DATED : October 28, 2014
INVENTOR(S) : Roy Meade et al.

It is certified that error appears in the above-identified patent and that said Letters Patent is hereby corrected as shown below:

On the Title page, in item (75), in column 1, in "Inventors", line 2, delete "Metar" and insert -- Meitar --, therefor.

In the Claims

In column 6, line 55, in Claim 1, delete "elavationally" and insert -- elevationally --, therefor.

Signed and Sealed this
Thirtieth Day of December, 2014

Michelle K. Lee
*Deputy Director of the United States Patent and Trademark Office*